United States Patent
Croft et al.

(10) Patent No.: US 9,130,088 B2
(45) Date of Patent: Sep. 8, 2015

(54) SOLAR PANEL WITH INTEGRATED MOUNTING CLIP/SHIPPING SUPPORT

(71) Applicant: MiaSole, Santa Clara, CA (US)

(72) Inventors: Steven Croft, Menlo Park, CA (US); Will McColl, Palo Alto, CA (US); Whit Halstead, Palo Alto, CA (US)

(73) Assignee: APOLLO PRECISION FUJIAN LIMITED, Fujian (CN)

( * ) Notice: Subject to any disclaimer, the term of this patent is extended or adjusted under 35 U.S.C. 154(b) by 169 days.

(21) Appl. No.: 13/670,804

(22) Filed: Nov. 7, 2012

(65) Prior Publication Data

US 2013/0133723 A1 May 30, 2013

Related U.S. Application Data

(60) Provisional application No. 61/557,010, filed on Nov. 8, 2011.

(51) Int. Cl.
| | |
|---|---|
| *B21D 53/06* | (2006.01) |
| *H01L 31/042* | (2014.01) |
| *F16M 13/06* | (2006.01) |
| *H01L 31/02* | (2006.01) |
| *F24J 2/52* | (2006.01) |

(52) U.S. Cl.
CPC ............ *H01L 31/0422* (2013.01); *F16M 13/06* (2013.01); *F24J 2/5254* (2013.01); *H01L 31/02* (2013.01); *H02S 20/00* (2013.01); *F24J 2/523* (2013.01); *F24J 2/5258* (2013.01); *F24J 2002/5279* (2013.01); *Y02B 10/12* (2013.01); *Y02E 10/47* (2013.01); *Y02E 10/50* (2013.01)

(58) Field of Classification Search
CPC ...... H01L 31/0422; H01L 31/02; H02S 20/00; F24J 2/5254; F24J 2002/5279; F24J 2/5258; F24J 2/523; F16M 13/06; Y10T 29/49355; Y02B 10/12
USPC .............. 29/890.033, 464, 466, 467, 468, 29/525.01; 403/375, 408.1; 136/251; 211/41.14, 194
See application file for complete search history.

(56) References Cited

U.S. PATENT DOCUMENTS

2006/0005875 A1* 1/2006 Haberlein ..................... 136/251
2007/0068882 A1* 3/2007 Yoshizawa ................. 211/41.18

FOREIGN PATENT DOCUMENTS

JP          2006021800 A * 1/2006  ............ B65D 19/06

OTHER PUBLICATIONS

Machine Translation of Miyagawa (JP 2006021800 A) Jan. 26, 2006.*

* cited by examiner

*Primary Examiner* — Ryan J Walters
(74) *Attorney, Agent, or Firm* — The Marbury Law Group PLLC

(57) ABSTRACT

An integral mounting and shipping support device. The device includes a mounting structure and a shipping support structure. The shipping support structure is configured to grip an object to be shipped. The device also includes a first stacking structure and a second stacking structure. The first stacking structure of a first mounting and shipping support device is configured to couple with the second stacking structure of a second mounting and shipping support device.

31 Claims, 4 Drawing Sheets

SOLAR PANEL WITH INTEGRATED MOUNTING CLIP/SHIPPING SUPPORT

FIELD

The present invention is directed to solar panels, in particular to solar panels having an integrated mounting clip that also may be used as a shipping support.

BACKGROUND

Conventionally, solar panels are produced in a factory, stacked on a shipping pallet and shipped to the installation site. To reduce packaging costs, in some cases, panels are not individually wrapped or boxed. Rather, to protect the panels from contacting each other and damaging each other during shipping, nesting plastic corner pieces are provided between each panel in the stack.

SUMMARY

An embodiment relates to an integral mounting and shipping support device. The device includes a mounting structure and a shipping support structure. The shipping support structure is configured to grip an object to be shipped. The device also includes a first stacking structure and a second stacking structure. The first stacking structure of a first mounting and shipping support device is configured to couple with the second stacking structure of a second mounting and shipping support device.

Another embodiment relates to a solar panel device. The solar panel device includes a solar panel attached to at least one mounting and shipping support device. The mounting and shipping support device includes a shipping support structure attached to the solar panel and a mounting structure adapted to mount to a solar panel rack. The device also includes a first stacking structure located on a first side of the mounting and shipping support device and a second stacking structure located on an opposite second side of the mounting and shipping support device.

Another embodiment, relates to a method. The method includes steps of providing a plurality of solar panels and stacking the plurality of solar panels by coupling the one or more mounting and shipping support devices of each of the plurality of solar panels with the one or more mounting and shipping support devices of an adjacent one of the plurality of solar panels to form a stack of solar panels. Each of the solar panels is attached to one or more mounting and shipping support devices. The shipping support device includes a mounting structure and a shipping support structure. The shipping support structure is attached to one of the plurality of the solar panels. The shipping support structure also includes a first stacking structure and a second stacking structure.

Another embodiment, relates to a method. The method includes the step of providing a stack of solar panels comprising a plurality of solar panels coupled to each other using one or more mounting and shipping support devices attached to each of the plurality of solar panels. The method also includes the steps of separating the stack of solar panels and coupling at least a first solar panel of the plurality of solar panels to a rack by coupling the mounting structure of the one or more support devices attached to the first solar panel to the rack. Each mounting and shipping support device includes a mounting structure, a shipping support structure attached to one of the plurality of the solar panels, a first stacking structure and a second stacking structure.

DETAILED DESCRIPTION

Conventional packaging for shipping of solar panels comprises either nested plastic corner pieces which are placed between the panels in a stack of panels or boxing each solar panel in its own shipping box. The nested plastic corner pieces have a step on which the solar panels are placed. Typically, a top portion of the corner pieces includes a protrusion that is configured to mate with a recess in a bottom portion of an adjacent corner piece. In this manner, corner pieces may be stacked in a nested fashion.

Typically, solar panels are not installed as individual, stand alone units. Rather, a number of solar panels are assembled, such as on a rooftop to provide power for a building, such as a home or office. When installing solar panels on a building, typically one or more racks are first affixed to the roof of the building. Generally, each rack is configured to hold several solar panels. After affixing the racks to the roof, solar panels are then mounted to the racks. Alternatively, the solar panels may first be mounted to the racks and the racks affixed to the roof.

The conventional nested corner pieces, while useful for shipping, do not include features that allow for mounting a solar panel to a rack. For mounting, the solar panels should be securely attached to the rack such that the panels will stay mounted even in bad weather, such as thunderstorms and high winds. Conventionally, when mounting solar panels, the nested corner pieces are removed (set aside as the solar panels are removed from the stack) and separate mounting clips affixed to the panels. The solar panels may then be mounted to the rack using the mounting clips.

The inventors have realized that significant cost savings can be achieved by providing a single element that can be attached to a solar panel for packaging (shipping support) during shipping, and may be used to mount the solar panel to a rack. Rather than installing mounting clips/racking clips after delivery to an installation site, the mounting clips/racking clips may be installed prior to delivery to the installation site. For example, the mounting clips/racking clips may be pre-installed at the factory or at an ancillary installation facility. With a proper design of the combination shipping standoff/mounting clip, solar panels can be shipped in a stack with the bottom of the stack on a shipping pallet. Each panel in the stack is supported by one or more combination shipping standoff/mounting clips and is maintained at a safe distance from the adjacent panel during shipping.

Figure 1:
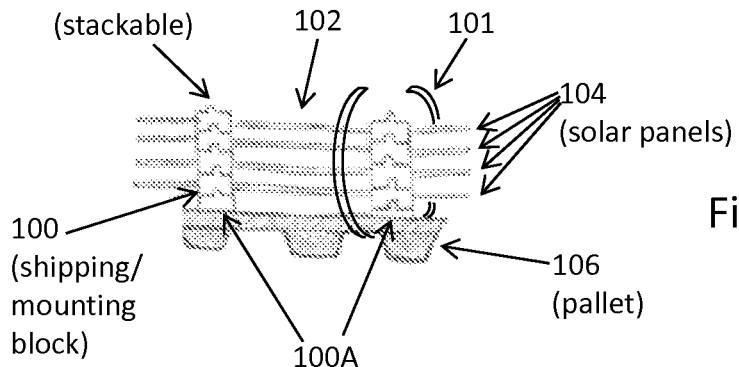
FIG. 1 is a side view of a stack of solar modules stacked with combination shipping standoff/mounting clips according to an embodiment.

FIG. 1 illustrates a stack 102 of solar panels 104 stacked on a pallet 106 with an embodiment of a combination shipping standoff/mounting clip 100. The stack 102 is located on a shipping pallet 106. In an embodiment, four combination shipping standoff/mounting clips 100 are attached to each solar panel 104 (e.g., one clip near every corner of panel 104). Preferably, the combination shipping standoff/mounting clips 100 are attached to the solar panels 104 at the factory in which the solar panels 104 are produced. However, the combination shipping standoff/mounting clips 100 may be attached to the solar panels 104 at an adjacent or nearby facility. Clips 100 are attached to edges of plate shaped solar panels 104.

In an embodiment, the solar panels 104 are square or rectangular in shape. Two combination shipping standoff/mounting clips 100 are attached to one side (i.e., side when viewed from the top) of the solar panel 104 and two combination shipping standoff/mounting clips 100 are attached to an opposite side of the solar panel 104. The use of four combination shipping standoff/mounting clips 100 is merely exemplary. In alternative embodiments, fewer or more combination shipping standoff/mounting clips 100 may be attached to the solar panel 104. For example, three or four combination shipping standoff/mounting clips 100 may be attached to each of the opposite sides of the solar panels 104 for added support. This may be advantageous for larger solar panels 104. Alternatively, some or all of the clips 100 may be attached to a corner of the panel 104 such that a clip straddles 2 adjacent sides of the panel.

Figure 2A:
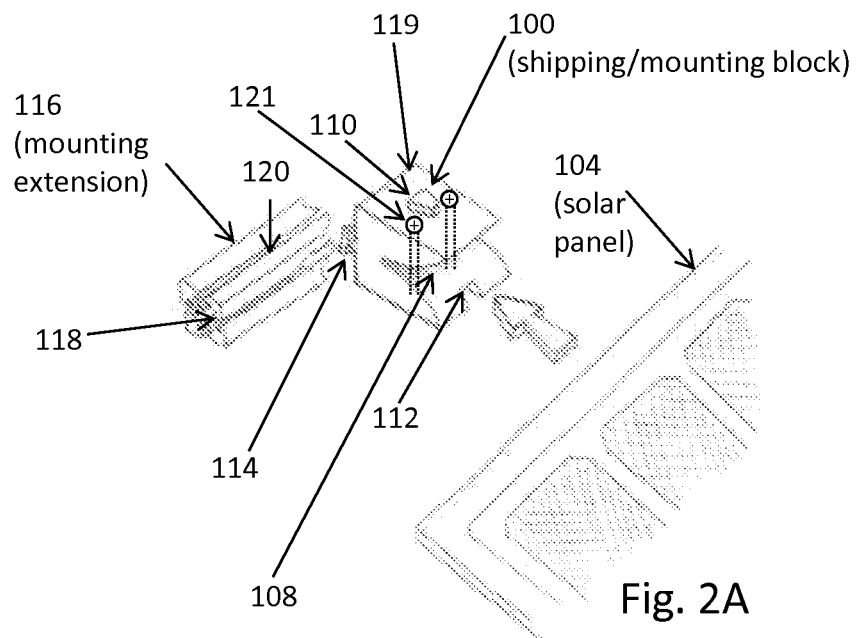
FIG. 2A is a close up perspective view of a combination shipping standoff/mounting clip according to an embodiment.

FIG. 2A is a close up perspective view of a combination shipping standoff/mounting clip 100 according to an embodiment. In this embodiment, the combination shipping standoff/mounting clip 100 includes a first recess 108 configured to receive a solar panel 104. The recess 108, for example, may be generally slit shaped. In an embodiment, the first recess 108 has generally a sideways "V" shape when viewed from the side. That is, the first recess 108 has a wide, outer portion corresponding to the top of a "V" configured to receive the edge of the solar panel 104. The first recess 108 narrows as it extends toward the center of the combination shipping standoff/mounting clip 100. In an embodiment, the narrow portion of the first recess 108 is narrower than the thickness of the solar panel 104. Preferably, the combination shipping standoff/mounting clip 100 includes at least a portion made of a resilient material, such as deformable plastic. The combination of a narrowing recess and a resilient material aids in holding the solar panel 104 in place in clip 102 by friction, as the narrow portion of the first recesses 108 tends to pinch the solar panel 104 as the solar panel 104 is wedged into the first recesses 108. Alternatively, the clip 100 may hold the panel 104 by a method other than friction instead of or in addition to friction. In an embodiment, the clip 100 is attached to the solar panel 104 with a mechanical fastener, such as a clamp, screw or bolt. Alternatively, the clip 100 may be attached with a weld, an adhesive or with a spring or pressure member, etc. to hold the panel 104 in the clip 100 by mechanical, chemical or metallurgical measures. Thus, the clip 100 may be removably or permanently attached to the panel frame/edge or comprise an integral portion of the panel frame. The clip 100 may be generally referred to as a mounting and shipping support device.

Figure 4:
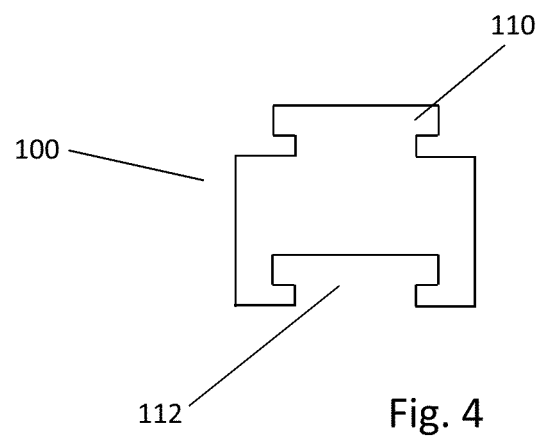
FIG. 4 is a front view of a combination shipping standoff/mounting clip according to an embodiment.

The combination shipping standoff/mounting clip 100 also includes a first protrusion 110 on a surface of the combination shipping standoff/mounting clip 100. For convenience of description, the surface with the first protrusion 110 will be identified as a top surface. The designation of top and bottom, however, is arbitrary. The first protrusion 110 may have an arbitrary shape. For example, the first protrusion 110 may be circular, triangular, square, rectangular, hexagonal or octagonal when viewed from above. Alternatively, the first protrusion 110 may have a nonsymmetric shape (when viewed from above), such as trapezoidal or irregular. A nonsymmetric shape has the advantage that it has a unique alignment. Thus, a second combination shipping standoff/mounting clip 100 with a mating recess 112 in the bottom surface of the clip 100 to the first protrusion 110 can only be stacked on a lower combination shipping standoff/mounting clips 100 in one orientation. Protrusion 110 can be on the bottom and recess 112 can be on the top of the clip 100 or vice versa. In an embodiment, recess 112 may have a "rail groove" shape that allows a mating protrusion 110 to slide into it. This embodiment is illustrated in FIG. 4.

In an alternative embodiment, the clip 100 may contain plural protrusions 110 and/or recesses 112. The plural protrusions 110 may be located on one side of the clip 100 and the plural recesses 112 may be located on the opposite side of the clip 100. Alternatively, one or more protrusions 110 and one or more recesses 112 may be located on one side of the clip 110, and additional one or more protrusions 110 and an additional one or more recesses 112 may be located on the opposite side of the clip 110. In this configuration, the protrusion(s) 110 on the first (e.g., top) side of a first clip fit into corresponding recess(es) on a second (e.g., bottom) side of an adjacent second clip, while the recess(es) on the first side of the first clip accept the corresponding protrusion(s) on the second side of the adjacent second clip. Thus, one side of a clip may contain at least one depression 112 configured to receive at least one protrusion 110 of an adjacent clip and at least one protrusion 110 configured to be received in at least one depression 112 of the adjacent clip.

Figure 3:
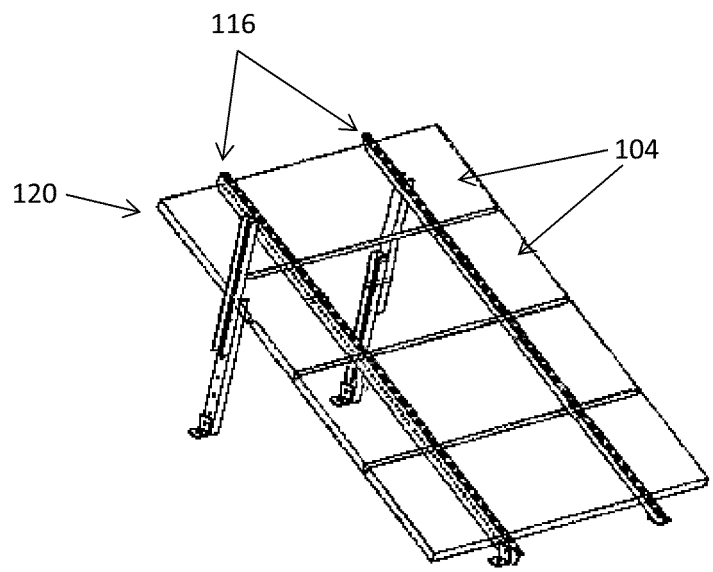
FIG. 3 is a perspective view of a rack suitable for use with the combination shipping standoff/mounting clips illustrated in FIGS. 2A and 2B.

In an embodiment, the combination shipping standoff/mounting clip 100 includes a second protrusion 114 on a back side of the combination shipping standoff/mounting clip 100. That is, the second protrusion 114 is on a side opposite the first recess 108. The second protrusion 114 is configured to mate with a recess 118 in a mounting portion 116 of a rack 120 (FIG. 3). In an alternative embodiment, the mounting portion 116 of the rack 120 can include one or more protrusions and the mounting structure of the combination shipping standoff/mounting clips 100 includes a mating recess.

In the embodiment illustrated in FIG. 2A, the recess 118 in the mounting portion 116 is configured as a slot and the second protrusion 114 has a "T" shape. That is, the second protrusion 114 has a narrower base portion with a wider cap portion. With this configuration, the location of the combination shipping standoff/mounting clips 100 and the thus, the solar panel 104 may be adjusted by sliding the second T-shaped protrusion 114 along the slot-like recess 116. In alternative embodiments, the recess 118 may be hole-shaped. That is, rather than a continuous slot, the recess 118 may have a shape that is generally circular, oval, triangular, square, rectangular, hexagonal, octagonal. The mounting portion 116 may have a series of discrete hole-shaped recesses 118 rather than a continuous slot shaped recess 118.

Preferably, the shipping standoff/mounting clips 100 are an integral device. That is, the mounting structure and the shipping support structure and stacking structure are a single unit which comprises a mounting and shipping support device. The shipping support structure 108 is configured to grip an object to be shipped, such as a solar panel. The stacking structure includes a first stacking structure, e.g. first protrusion 110, a second stacking structure, e.g. mating recess 112. The first stacking structure of a first mounting and shipping support device (combination shipping standoff/mounting clip 100) is configured to couple with the second stacking structure of a second mounting and shipping support device.

The combination shipping standoff/mounting clip 100 further includes a central supporting portion 119 having a first side, a second side opposite to the first side, a third side adjacent to the second side, and a fourth side opposite to the third side. The first stacking structure (first protrusion 110) is integrally located on the first (e.g. upper or lower) side of the central supporting portion of the device while the second stacking structure (mating recess 112) is integrally located on the second (e.g. opposite upper or lower) side of the central supporting portion of the device. The mounting structure (second protrusion 114) is integrally located on the third side (e.g. backside between the top and bottom sides) of the central supporting portion 119 of the device 100. Additionally, the shipping support structure (first recess 108) is integrally located on the fourth side (e.g., front side opposite the backside) of the central supporting portion of the device.

Figure 2B:
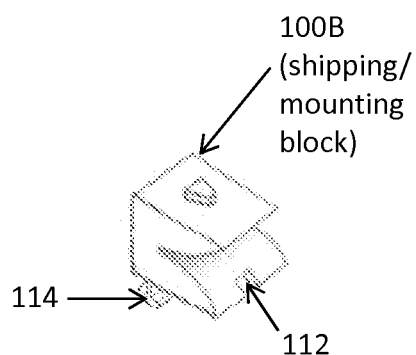
FIG. 2B is a perspective view of a combination shipping standoff/mounting clip according to another embodiment.

In an alternative embodiment illustrated in FIG. 2B, the mounting structure (e.g., the second protrusion 114) is located on the same side of the clip 100B as at least one stacking structure (e.g., one or more protrusions 110 and/or recesses 112). For example, the second protrusion 114 may be located on same lower (second) side of the clip 100B as the recess 112. In this embodiment, the mounting extrusion 116 may be located below the clip 100B as shown in FIG. 4 instead of adjacent to the back side of the clip 100B as shown in FIG. 2A. The second protrusion 114 in the lower side of the clip 100B may be mounted in a top channel 119 in the mounting extrusion 116. In this embodiment, adjacent solar panels 104 may be located closer to each other without intervening mounting extrusions 116 between the sides of adjacent solar panels 104, as shown in FIG. 4. In this embodiment, the protrusion(s) 110 located on one (e.g., upper) side of the clip 100B should have at least the same length (and preferably greater length in a direction away from the clip) as the second protrusion 114 located on the opposite (e.g., lower) side of the clip, so that the protrusion(s) 110 can reach into the recess(es) 112 in the adjacent clip 100B.

Alternatively, if the first protrusion(s) 110 and the second protrusion 114 are located on the same (e.g., lower) side of the clip 100B, then the first protrusion 110 is preferably shorter than the second protrusion 114 to allow the second protrusion 114 to be mounted to the mounting extrusion 116 without interference from the first protrusion(s) 110. In this configuration, the recess(es) 112 in each clip may be located in a boss or other upraised portion in the upper side of the clip to allow the protrusion(s) 110 to be inserted into the recess(es) 112 of an adjacent clip without interference from the second protrusion 114. The sum of the length of the first protrusion 110 plus the height of the boss in the upper side of the clip should be greater than the length of the second protrusion 114, so that the protrusion(s) 110 can reach into the recess(es) 112 in the adjacent clip. This configuration is advantageous because it only requires simple recess(es) 112 to be made in the pallet 106 or in structure 100A.

In another embodiment, the clip 100B has a dual function mounting structure (e.g., dual function second protrusion 114). The mounting structure is used both for mounting the solar panel 104 to the mounting portion 116 of the rack 120, and for stacking the panels 104 in a stack 102 on a pallet 106. For example, if the mounting structure 114 comprises a protrusion located on the lower side of the clip 100B, then this protrusion 114 may be inserted into recess 119 in the upper side of mounting extrusion 116 when the panels 104 are mounted to the rack, and this protrusion 114 may be inserted into a recess 112 in an adjacent clip 100B (or into a recess located in a pallet 106 or into a recess located in structure 100A on the pallet) when the panels 104 are stacked in a stack 102 on the pallet 106. In this embodiment, the stacking structure (e.g., recess 112) on the same side (e.g., the lower side) of the clip 100B may be omitted. Alternatively, the stacking structure (e.g., recess 112) on the same side (e.g., the lower side) of the clip 100B may be retained to accept a protrusion 110 located on an upper side of an adjacent clip (or on the pallet 106 or on structure 100A on the pallet). This provides interlocking protrusions and recesses on mating sides of adjacent clips 100B. While a single protrusion 114 has been described above, it should be understood that each clip 100, 100B, may include multiple single function or dual function protrusions 114 in the same side.

In another alternative configuration, the dual function mounting structure 114 may comprise one or more recesses rather than a protrusion. In this configuration, the recess accepts a protrusion from an adjacent clip during stacking of the panels 104 in a stack 102, and the recess accepts a different protrusion from the mounting structure 116 of the rack 120 during mounting of the panels 104 on the rack 120.

In the embodiments described above, the shipping support structure comprises a clip. However, the structure may comprise a clamp, bolt, pressure member, spring or integral part of the panel 104 frame. In an embodiment, the shipping support structure is configured to support a solar panel 104. Alternatively, the shipping support structure may be configured to support other products to be shipped, such as steel or glass plates, ceramic tiles and the like. In an embodiment, the mounting structure is configured to mount the solar panel 104 to a solar panel rack 120. One of the respective first stacking structure and the second stacking structure is a protrusion 110 and the other is a depression/recess 112. Each respective mounting structure may be a protrusion or a depression.

Figure 5A:
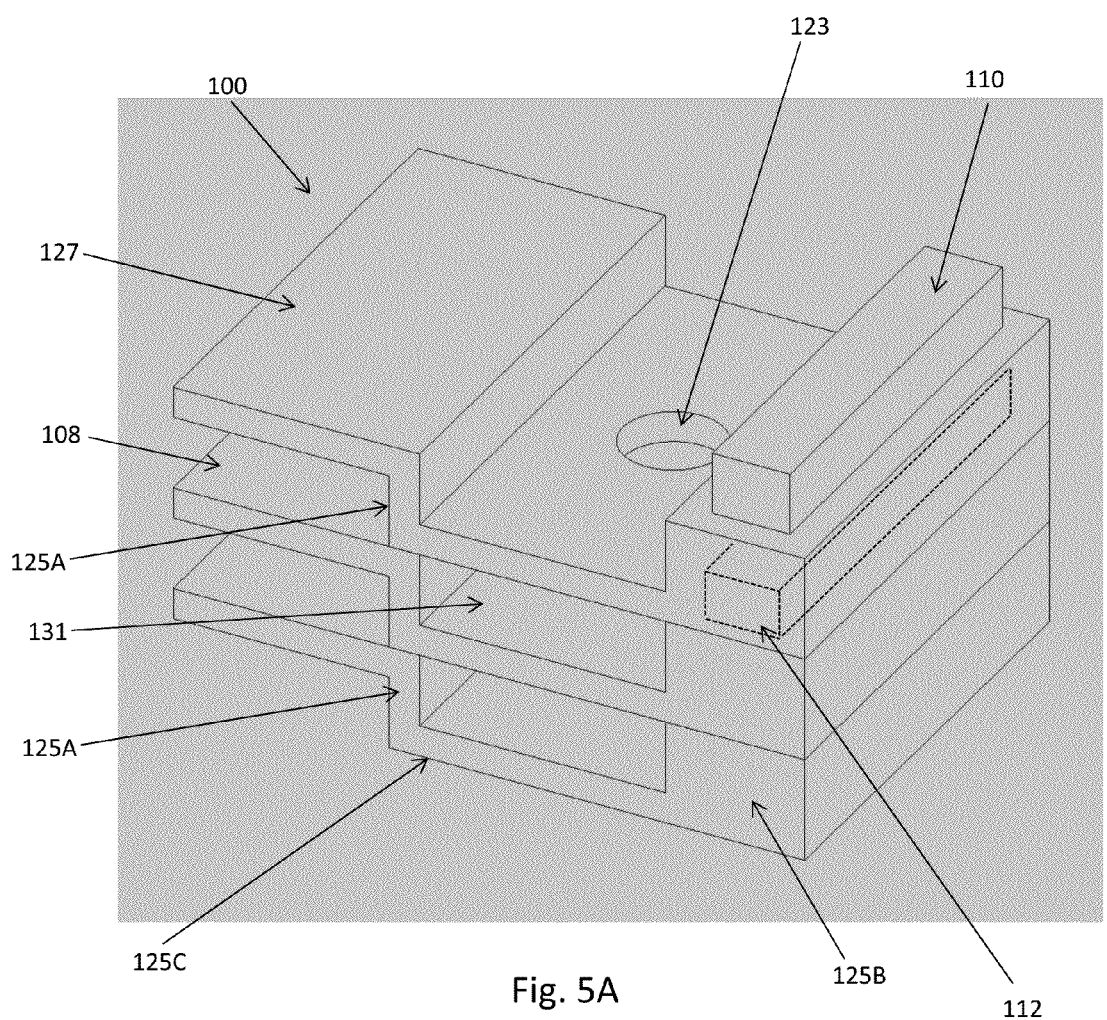
FIG. 5A is perspective view of a combination shipping standoff/mounting clip according to another embodiment.
Figure 5B:
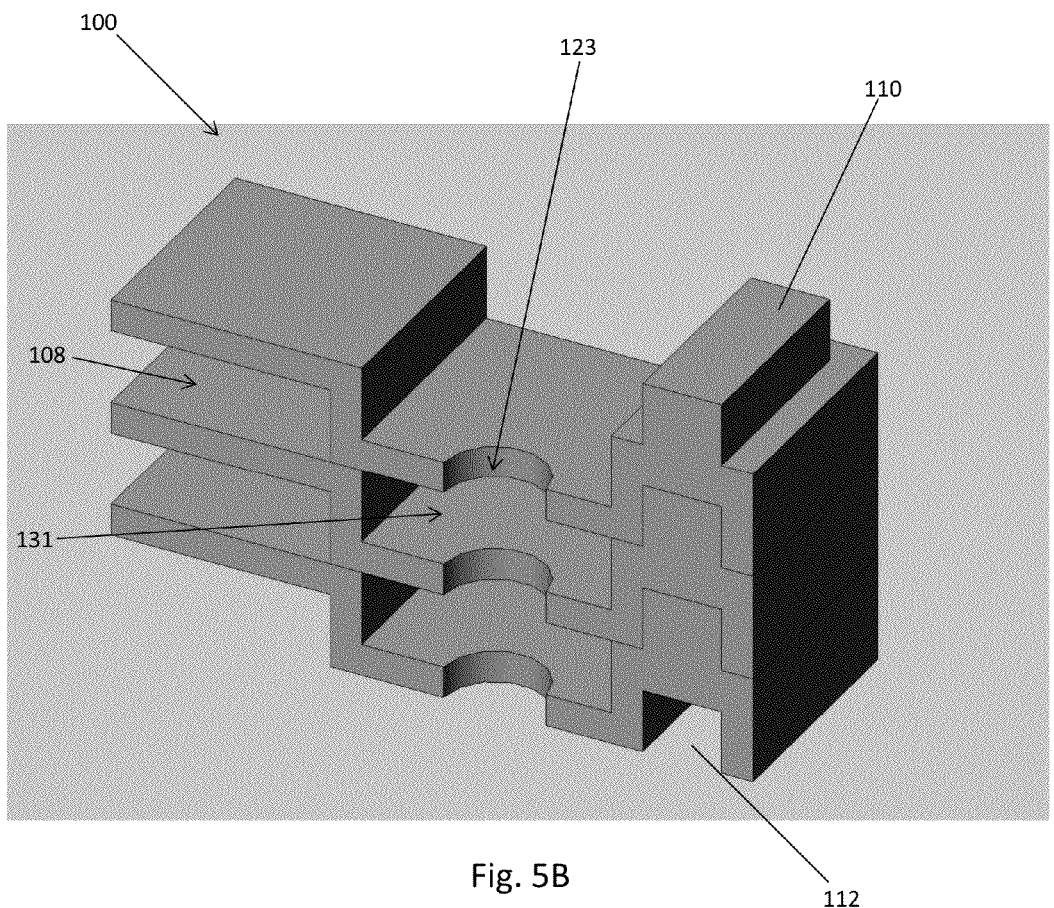
FIG. 5B is a cross sectional view of the combination shipping standoff/mounting clip illustrated in FIG. 5A.

An alternative embodiment of the combination shipping standoff/mounting clip 100 is illustrated in FIGS. 5A and 5B. In this embodiment, the combination shipping standoff/mounting clip 100 has a generally "U" shaped portion. One arm 125B of the "U" shaped portion includes a protrusion 110 on the top of the arm 125B and a depression/recess 112 in the bottom of the arm 125B. Alternatively, the protrusion 110 may be on the bottom of the arm 125B and the depression/recess 112 in the top of the arm 125B. In an embodiment, as illustrated in FIG. 5A, the protrusion 110 and the depression/recess 112 do not extend the full depth of the arm 125B. In an alternative embodiment, illustrated in FIG. 5B, both the protrusion 110 and the depression/recess 112 extend the full depth of the arm 125B.

Attached to the other arm 125A is a flange 127. Successive flanges 127 in a stack form the first recess 108 configured to receive a solar panel 104. An optional flexible gasket (not shown) may be inserted into the first recess 108 to aid in securing the solar panel 104 in the first recess 104. In this embodiment, successive base portions 125C of the U-shaped portion of the clip 100 in combination with the arms 125A, 125B form a channel 131 with which the clip 100 may be affixed to a mounting portion 116, e.g. a support beam, of a rack 120. The base portion 125C of the U-shaped portion of the clip 100 may optionally include a hole 123. A fastener 121, such as bolt(s) or clamp(s) (Shown in FIG. 2A) may be inserted through the hole 123. In this manner, the clip 100 may be more securely fastened to the support beam 116 of the rack 120. The part 100 may be made using any suitable material, such as metal or plastic, and may be made using any suitable method, such as molding or casting (e.g., die casting, for example). A similar shape may also be drawn from a metal sheet with the appropriate tooling or cut from the metal sheet and then folded up to generate the shape of the clip.

In an alternative embodiment, two of the combination shipping standoff/mounting clips 100 illustrated in FIGS. 5A and 5B may be fabricated as an integral unit. In this embodiment, the integral unit clip 100 includes a fully formed channel 131 and a fully formed first recess 108. The solar panel 104 may be attached to support beam 116 of a frame 120 by sliding the clips 100 over the support beam 116. The solar panel 104 located in the first recess 108 may then be further secured to the frame 120 by inserting a fastener 121 through the hole 123 and clamping or binding the integral unit clip 100 to the frame 120. In this embodiment, instead of the second protrusion 114 on the back or bottom side of the clip 100, the channel located in the middle of the clip 100 is used to secure the panel 104 to the frame 120. Furthermore, two clips 100 may be fastened together to secure the panel 104 held between the clips 100 to the frame 120.

An embodiment includes a solar panel device that includes a solar panel 104 attached to at least one mounting and shipping support device (combination shipping standoff/mounting clip) 100. A plurality of solar panel devices of this embodiment may be stacked (as illustrated in FIG. 1 and discussed in more detail below) and later mounted to a solar panel rack 120, as shown in FIG. 3.

Another embodiment includes a stack 102 comprising a plurality of the solar panel devices in which each solar panel 104 in the stack 102 is attached to at least one respective mounting and shipping support device 100. A first stacking structure of each mounting and shipping support device 100 is coupled to a second stacking structure of a mounting and shipping support device 100 attached to an adjacent solar panel 104 in the stack 102. The stack 102 may further include a pallet 106. Preferably, the pallet 106 includes at least one first or second stacking structure 100A coupled to the first or second stacking structure 110 or 112 of the at least one mounting and shipping support device 100 attached to the lowest solar panel 104 in the stack 102.

Embodiments of the invention also include methods of using the devices 100. One method includes providing a plurality of solar panels 104 in which each of the plurality of solar panels 104 is attached to one or more mounting and shipping support device 100. The mounting and shipping support device 100 includes a mounting structure 114 and a shipping support structure 108. The shipping support structure 108 is attached to one of the plurality of the solar panels 104. The method also includes a step of stacking the plurality of solar panels 102 by coupling the one or more mounting and shipping support device 100 of each of the plurality of solar panels 104 with the one or more mounting and shipping support devices 100 of an adjacent one of the plurality of solar panels 104 to form a stack 102 of solar panels 104.

The method may further include coupling the one or more mounting and shipping support devices of a bottom solar panel 104 in the stack 102 to a pallet 106. The method may also further include separating the stack 102 of solar panels 104, and coupling at least a first solar panel 104 of the plurality of solar panels 104 to a rack 120 by coupling the mounting structure 114 of the one or more support devices 100 attached to the first solar panel 104 to the portion 118 of the rack 120.

In the method, the shipping support structure 108 may be attached to the first solar 104 panel by friction or by clamping with a fastener 121, such as bolt(s) or clamp(s) as shown in FIG. 2A. The mounting structure 114 may comprise a protrusion or a depression and the rack 120 may comprise another one of the depression or the protrusion 118. Coupling the first solar panel to the rack includes sliding the protrusion into the depression. The method may further include a step of bolting the shipping support structure 108 to the first solar panel 104 after separating the stack 102 by inserting bolts into aligned holes through the front of support device 100 and the frame of the panel 104.

Another embodiment of the method includes providing a stack 102 of solar panels 104 comprising a plurality of solar panels 104 coupled to each other using one or more mounting and shipping support devices 100 attached to each of the plurality of solar panels 104. The method also includes a step of coupling at least a first solar panel 104 of the plurality of solar panels 104 to a rack 120 by coupling the mounting structure 114 of the one or more support devices 100 attached to the first solar panel 104 to the rack 120. In this method, the step of coupling the first solar panel 104 to the rack 120 comprises sliding the protrusion 114 into the depression 118 in the rack 120. The method may further include bolting the shipping support structure to the first solar panel 104 after separating the stack 102, as noted above. Optionally, the stack 102 of solar panels 104 may also be secured to the pallet 106 with a strap 101 as shown in FIG. 1. Thus, the clips 100 constrain the movement of the stack 102 of solar panels 104 in the x-y plane while the strap constrains the movement of the stack 102 in the z (vertical) direction.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method, comprising:
   providing a plurality of solar panels;
   attaching the plurality of solar panels to a plurality of mounting and shipping support devices, each mounting and shipping support device comprising:
   a mounting structure;
   a shipping support structure configured to receive one of the plurality of the solar panels;
   a first stacking structure; and
   a second stacking structure;
   stacking the plurality of solar panels by coupling the mounting and shipping support devices of each of the plurality of solar panels with the mounting and shipping support devices of an adjacent one of the plurality of solar panels to form a stack of solar panels;
   coupling the stack to a pallet at one site by mating mounting structures of a first subset of the plurality of the mounting and shipping support devices that is attached to the bottom solar panel to respective mating structures on the pallet;
   separating the stack of solar panels by separating the plurality of mounting and shipping support devices at another site; and
   coupling at least a first solar panel of the plurality of solar panels to a rack by coupling a second subset of the plurality of the mounting structures of the mounting and shipping support devices attached to the first solar panel to the rack after separating the stack of solar panels.

2. The method of claim 1, wherein:
   the shipping support structure is attached to the first solar panel by friction;
   the mounting structure comprises a mounting protrusion or a mounting depression;

the rack comprises a rack depression or a rack protrusion; and coupling the first solar panel to the rack comprises sliding the mounting or rack protrusion into the mounting or rack depression.

3. The method of claim 2, further comprising bolting the shipping support structure to the first solar panel after separating the stack.

4. The method of claim 1, wherein each mounting structure comprises a dual function mounting structure that is configured to mount to the pallet and to the rack.

5. The method of claim 4, wherein the pallet comprises a set of mating mounting structures configured to mate with a respective dual function mounting structure.

6. The method of claim 5, wherein the rack comprises an additional set of mating mounting structures configured to mate with a respective dual function mounting structure.

7. The method of claim 4, wherein each mounting structure is located on a bottom side of a respective mounting and shipping support device.

8. The method of claim 4, wherein the dual function mating structure comprises a set of at least one protrusion or a set of at least one recess.

9. The method of claim 1, wherein each mounting structure of a mounting and shipping support device is configured be mounted to the rack.

10. The method of claim 1, wherein the pallet comprises a mating structure that engages a first stacking structure or a second stacking structure of the first subset of the plurality of mounting and shipping support devices.

11. The method of claim 1, wherein:
each first stacking structure comprises a protrusion; and
each second stacking structure comprises a mating recess configured to engage a protrusion from another first stacking structure.

12. The method of claim 1, wherein the mounting structure is located on an opposite side of the shipping support structure.

13. The method of claim 1, wherein each mounting structure is located on a same side of a respective mounting and shipping support device as a first stacking structure or a second stacking structure of the respective mounting and shipping support device.

14. The method of claim 1, wherein the rack comprises a mounting extrusion that extends along a lengthwise direction, and the method further comprises mounting two or more solar panels to the mounting extension such that the two or more solar panels are mounted to different areas of the mounting extension and do not overlap another solar panel.

15. A method, comprising:
providing a stack of solar panels comprising a plurality of solar panels coupled to each other using a plurality of mounting and shipping support devices attached to each of the plurality of solar panels, wherein each mounting and shipping support device comprises:
a mounting structure;
a shipping support structure configured to receive one of the plurality of the solar panels;
a first stacking structure; and
a second stacking structure;
coupling the stack to a pallet at one site by mating the mounting structures of a first subset of the plurality of the mounting and shipping support devices that is attached to the bottom solar panel to respective mating structures on the pallet, wherein first or second stacking structures of the first subset of the plurality of mounting and shipping support devices mate with a respective mating structure on the pallet;
separating the stack of solar panels at another site; and
coupling at least a first solar panel of the plurality of solar panels to a rack by coupling a second subset of mounting structures of the plurality of mounting and shipping support devices attached to the first solar panel to the rack after separating the stack of solar panels.

16. The method of claim 15, wherein:
the shipping support structure is attached to the first solar panel by friction;
the mounting structure comprises a mounting protrusion or a mounting depression;
the rack comprises a rack depression or a rack protrusion; and
coupling the first solar panel to the rack comprises sliding the mounting or rack protrusion into the mounting or rack depression.

17. The method of claim 16, further comprising bolting the shipping support structure to the first solar panel after separating the stack.

18. The method of claim 17, wherein each solar panel in the stack is attached to at least one respective mounting and shipping support device, and a first stacking structure of each mounting and shipping support device is coupled to a second stacking structure of a mounting and shipping support device attached to an adjacent solar panel in the stack.

19. The method of claim 15, wherein:
each mounting and shipping support device further comprises a central supporting portion having a first side, a second side opposite to the first side, a third side adjacent to the second side, and a fourth side opposite to the third side;
the first stacking structure is integrally located on the first side of the central supporting portion of a respective mounting and shipping support device;
the second stacking structure is integrally located on the second side of the central supporting portion of the respective mounting and shipping support device;
the mounting structure is integrally located on the second or on the third side of the central supporting portion of the respective mounting and shipping support device; and
the shipping support structure is integrally located on the fourth side of the central supporting portion of the respective mounting and shipping support devices.

20. The method of claim 15, wherein the second stacking structure comprises one or more protrusions or recesses in the second side of the central supporting portion of the respective mounting and shipping support device.

21. The method of claim 15, wherein each mounting structure comprises a dual function mounting structure that is configured to mount to the pallet and to the rack.

22. The method of Clam 21, wherein the pallet comprises a set of mating mounting structures configured to mate with a respective dual function mounting structure.

23. The method of claim 22, wherein the rack comprises an additional set of mating mounting structures configured to mate with a respective dual function mounting structure.

24. The method of claim 21, wherein each mounting structure is located on a bottom side of a respective mounting and shipping support device.

25. The method of claim 21, wherein the dual function mating structure comprises a set of at least one protrusion or a set of at least one recess.

26. The method of claim 15, wherein each mounting structure of a mounting and shipping support device is configured to be mounted to the rack.

27. The method of claim 15, wherein the pallet comprises a mating structure that engages a first stacking structure or a second stacking structure of the first subset of the plurality of mounting and shipping support devices.

28. The method of claim 15, wherein:
each first stacking structure comprises a protrusion; and
each second stacking structure comprises a mating recess configured to engage a protrusion from another first stacking structure.

29. The method of claim 15, wherein the mounting structure is located on an opposite side of the shipping support structure.

30. The method of claim 15, wherein each mounting structure is located on a same side of a respective mounting and shipping support device as a first stacking structure or a second stacking structure of the respective mounting and shipping device.

31. The method of claim 15, wherein the rack comprises a mounting extrusion that extends along a lengthwise direction, and the method further comprises mounting two or more solar panels to the mounting extension such that the two or more solar panels are mounted to different areas of the mounting extension and do not overlap another solar panel.

* * * * *